United States Patent [19]

Kawabata et al.

[11] Patent Number: 4,671,829

[45] Date of Patent: Jun. 9, 1987

[54] MANUFACTURING GREEN LIGHT EMITTING DIODES

[75] Inventors: Toshiharu Kawabata, Kyoto; Susumu Koike, Kawachinagano; Toshio Matsuda, Otsu; Hitoo Iwasa, Ibaraki, all of Japan

[73] Assignee: Matsushita Electric Industrial Co., Ltd., Osaka, Japan

[21] Appl. No.: 703,468

[22] Filed: Feb. 22, 1985

Related U.S. Application Data

[63] Continuation of Ser. No. 516,444, Jul. 22, 1983, abandoned.

[30] Foreign Application Priority Data

Jul. 28, 1982 [JP] Japan ................... 57-132724

[51] Int. Cl.$^4$ ............... H01L 21/208; H01L 33/00
[52] U.S. Cl. ............... 148/171; 148/DIG. 66; 29/569 L; 357/17
[58] Field of Search ............... 148/171, 172, DIG. 25, 148/DIG. 66, DIG. 100; 357/17; 29/569 L

[56] References Cited

U.S. PATENT DOCUMENTS 4,303,464 12/1981 Suzuki et al. .................. 156/605

FOREIGN PATENT DOCUMENTS

| 0102192 | 3/1984 | European Pat. Off. | 437/108 |
| 0009983 | 1/1984 | Japan | 437/127 |
| 0080981 | 5/1984 | Japan | 437/104 |
| 0214276 | 12/1984 | Japan | 437/127 |

OTHER PUBLICATIONS

Keller, *Materials, Properties and Preparation* North-Holland Publishing Co. 1980, Amsterdam, pp. 462–463.
Sugiura et al., "Low Temperature Growth of GaP LPE Layer from in Solvent" *J. of Crystal Growth* 46 (1979) 595–600.

*Primary Examiner*—Olik Chaudhuri
*Attorney, Agent, or Firm*—Stevens, Davis, Miller & Mosher

[57] ABSTRACT

In a method of manufacturing pure green light emitting diodes, after an n-type GaP epitaxial layer with thickness larger than or equal to a value for which the density of dislocation on the surface becomes less than or equal to $1 \times 10^4$ cm$^{-2}$ is grown on an n-type GaP substrate, a p-type GaP epitaxial layer is grown on the above n-type epitaxial layer. Even with the use of a GaP substrate with normal dislocation density, the density of dislocation in the neighborhood of the p-n junction becomes low and therefore GaP green light emitting diodes with high intensity of light emission are obtained.

2 Claims, 4 Drawing Figures

MANUFACTURING GREEN LIGHT EMITTING DIODES

This application is a continuation of application Ser. No. 516,444, filed July 22, 1983 now abandoned.

Visible light emitting diodes (LED's) are widely used as pilot lamps, and display devices such as numeric display units and level indicators. Especially, in the field of displays, LED's of three colors—red, yellow and green—are frequently used. Most visible LED's are provided by GaP red LED's as well as by GaP green LED's formed by sequentially growing epitaxial layers of n-type and p-type on a gallium phosphide (GaP) substrate. This invention relates to a manufacturing method of GaP green LED's suitable for the above-described display devices.

There are two kinds of GaP green LED's: yellow-green LED's doped with nitrogen (N) as a radiation center and pure green LED's without N doping. The structure of these types consists of an n-type epitaxial layer grown on an n-type GaP substrate and a P-type epitaxial layer grown on the n-type layer by using a liquid phase epitaxial method. The intensity of light emission of green LED's depends on the crystal quality of the epitaxial layer, and particularly on the density of dislocation. The existence of dislocation in the crystal appears as an etch-pit (D-pit) on the crystal surface. The number of etch pits in a unit area is called the etch pits density (EPD). Thus the dislocation density can be indicated by the etch pits density.

Several trials have been made to manufacture GaP green LED's by using a low EPD GaP substrate in order to obtain high light emission intensity. However, it has been difficult to obtain any GaP LED's belonging to the category of high emission LED's with use of such a commercially sold GaP substrate.

The present invention will be made more apparent from the following detailed description taken in conjunction with the accompanying drawings.

BRIEF DESCRIPTION OF THE FIGURES

FIG. 1 shows the result of an experiment done by the inventors concerning the relation between the light emission intensity of GaP pure green LED's and the EPD on the surface of an n-type epitaxial layer. After the intensity of light emission of GaP pure green LED's was measured, the P-type epitaxial layer of the GaP pure green LED's was removed to expose an n-type epitaxial layer. EPD of the surface was measured and plotted. According to the result of this experiment, the intensity of light emission varies abruptly near EPD$=1\times10^4$ cm$^{-2}$. It was made clear that the intensity of light emission of GaP pure green LED's with an EPD less than or equal to $1\times10^4$ cm$^{-2}$ could be considered to belong to the category of high brightness LED's. A similar result was obtained by an experiment made with GaP yellow-green LED's.

Meanwhile, it is not easy to obtain a GaP substrate with EPD lower than or equal to $1\times10^{-4}$ cm$^{-2}$ from a commercially sold GaP substrate. It is also difficult to manufacture such a GaP substrate with high reproducibility.

Figure 1:
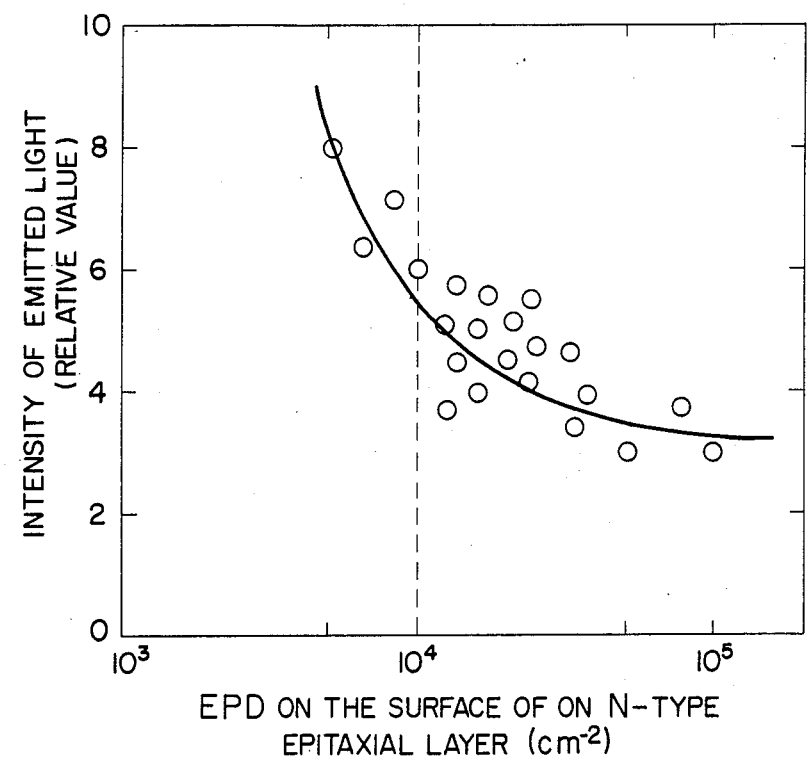
FIG. 1 shows the relation between the light emission intensity of GaP pure green LED's and the EPD on the surface of an n-type epitaxial layer formed on an n-type GaP substrate.
Figure 2:
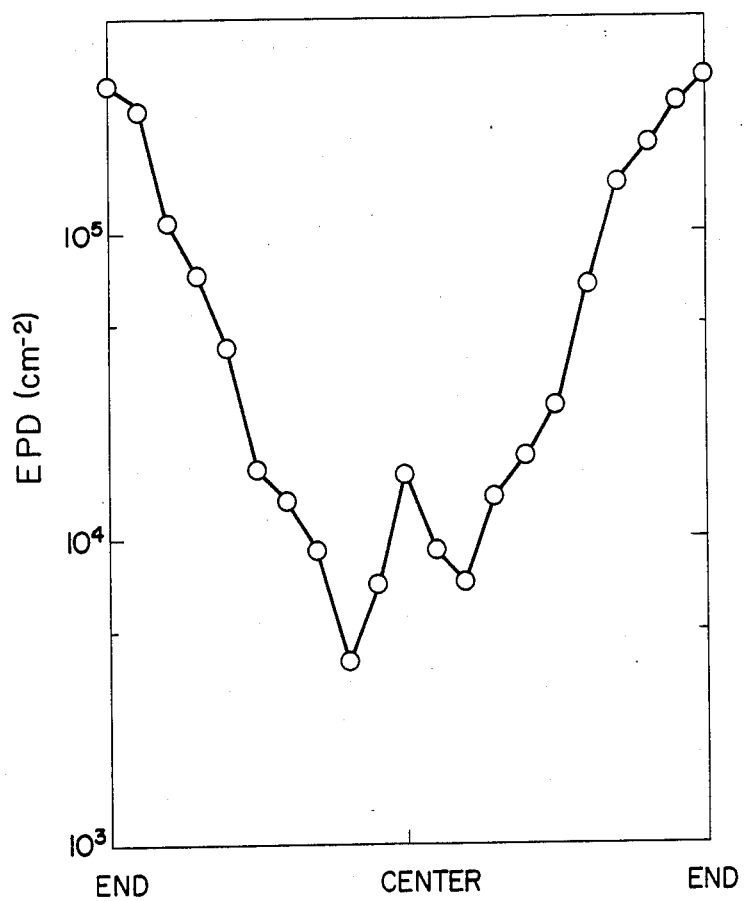
FIG. 2 is a diagram showing the distribution of EPD on a commercially sold GaP substrate with low EPD.

FIG. 2 is a diagram showing the distribution of EPD in a GaP substrate (wafer) which is commercially sold as a low EPD substrate. It is seen that EPD is low in the central part but high at the ends of the substrate. The average value of EPD is about $1\times10^5$ cm$^{-2}$. The average value in the central part is about $3\times10^4$ cm$^{-2}$.

The conventional GaP green LED's have been formed with such a GaP substrate as described above. Therefore, it has been extremely difficult to manufacture GaP green LED's with high intensity of light emission. Even if the GaP green LED's fabricated in the central part of the GaP substrate has a high emission intensity, the yield of manufacture is extremely low. This makes the cost very high. Any universal use was, therefore, not possible.

The first objective of this invention is to provide a method of manufacturing GaP green LED's with high intensity of light emission with good productivity, with the above-described conventionally used GaP substrate being used as the starting material for the GaP green LED's. The second objective of this invention is to make the intensities of light emission of many GaP green LED's formed in a single GaP substrate homogeneous, thereby to increase the yield of manufacture. The third objective of this invention is to decrease the cost of GaP green LED's and ensure the universal use of the LED's.

The present invention is based on the findings that a dislocation of an epitaxial layer grown on the GaP substrate is continued from the dislocation of the GaP substrate but that the density of dislocation decreases with the growth of epitaxial layer and that the latter tendency becomes more remarkable as EPD becomes higher. After the growth of an n-type epitaxial layer whose thickness is equal to or larger than the thickness securing EPD lower than or equal to $1\times10^4$ cm$^{-2}$ on an n-type GaP substrate, a p-type epitaxial layer is formed on the same n-type epitaxial layer for the fabrication of GaP green LED's. According to the characteristics of the above method, EPD in the part of the epitaxial layer lying near the p-n junction has such a value capable of giving high intensity of light emission. Thus, high brightness GaP green LED's can be obtained.

Figure 3:
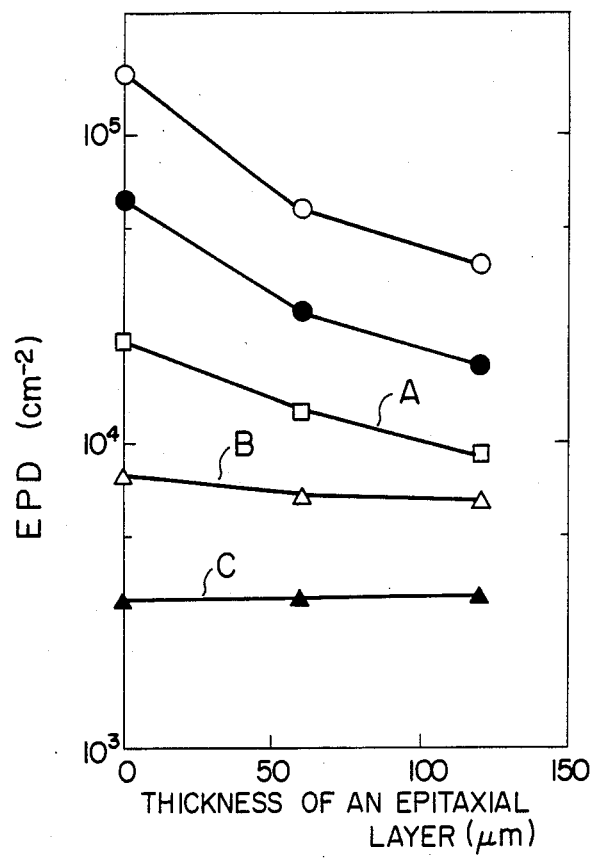
FIG. 3 is a diagram showing the variation of EPD against the thickness of an epitaxial layer.

FIG. 3 is a diagram showing the variation of EPD against the thickness of an epitaxial layer grown on a GaP substrate. It is seen that the value of EPD decreases with increase of the thickness of the epitaxial layer. It is inferred that this phenomenon appears due to the fact that, as the epitaxial layer grows, dislocations join with each other or disappear spontaneously. In FIG. 3, the curve A shows the variation of EPD against the thickness of the epitaxial layer formed on a commercially sold GaP substrate with low EPD. As can be seen from the figure, if the thickness of the epitaxial layer is equal to or above 100 $\mu$m, the value of EPD on the surface becomes lower than or equal to $1\times10^4$ cm$^{-2}$ which is necessary to obtain GaP green LED's with high intensity of light emission. Although it is possible to manufacture a GaP substrate with low EPD as shown by curves B and C, the yield becomes low. Since such a GaP substrate is unprofitable in view of cost, it can not be applied to industrial use.

According to the method of this invention, an n-type GaP substrate as shown by curve A in the above figure is employed. An n-type epitaxial layer with more than or equal to 100 μm is grown on the above n-type GaP substrate and a P-type epitaxial layer is grown on the above n-type epitaxial layer to form GaP green LED's. The density of dislocation in the neighborhood of the p-n junction is low, and hence these GaP green LED's have a characteristic with high intensity of light emission.

When GaP is epitaxially grown from a liquid phase using a gradual cooling method and the growth is started from an extremely high temperature, the epitaxial layer becomes thick. However, the formed crystal deviates from stoichiometry and has a high density of phosphor (P) vacancy. GaP green LED's containing such an epitaxial layer have low intensity of light emission.

In order to remove this inconvenience, in the usual liquid phase epitaxial growth, the growth is started from about 1000° C. However, according to the method, an epitaxial layer can be grown to a thickness of only about 50 μm. It is not possible to grow an epitaxial layer with thickness exceeding 100 μm. According to this invention, the manufacture of the GaP green LED's is made as follows. An n-type epitaxial layer is grown to thickness of about 70 μm on the n-type GaP substrate with gradual cooling of a melt from 1020° C. to 800° C. Furthermore, a further n-type epitaxial layer is grown to thickness of about 50 μm on the resulting substrate with gradual cooling of the melt from 1020° C. to 900° C. Thereafter, a p-layer is grown by gradual cooling of the melt from 900° C. to 800° C. As a result, the thickness of the n-type epitaxial layer becomes totally 120 μm, and the value of EPD in the neighborhood of the p-n junction is remarkably decreased.

Figure 4:
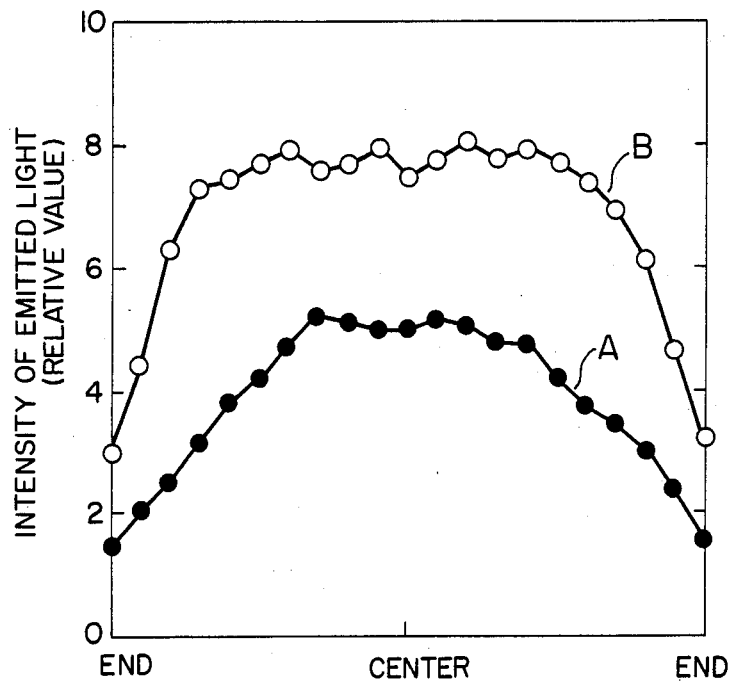
FIG. 4 is a diagram showing the distribution of light emission intensity of GaP pure green LED's, where the n-type epitaxial layers formed on the n-type GaP substrate are designed to have thickness of 50 $\mu$m and 120 $\mu$m.

FIG. 4 shows the distribution of the intensities of light emission of GaP green LED's wafer formed by using a GaP substrate with low EPD, in which the thickness of the n-type epitaxial layer is set at 50 μm, and that of GaP green LED's wafer formed by the above-mentioned method in which the thickness of the n-type epitaxial layer is set at 120 μm. The curve A denotes the former distribution while the curve B denotes the latter distribution. As can be seen from the Figure, the intensity of light emission B is larger than that of the conventional method A by about 50% in the central part and by about 100% in the peripheral part of the wafer. Furthermore, the distribution of light intensity over the wafer according to the present invention is more homogeneous than that of the conventional method.

As is clear from the foregoing explanation, according to the method of this invention, the density of dislocation near the p-n junction is decreased remarkably even with use of a GaP substrate with a usual dislocation density. Therefore, the invention can provide GaP green LED's with high intensity of light emission. Moreover, since the distribution of intensity of light emission in the single GaP wafer can be made homogeneous, the yield of manufacture can be improved remarkably. This is effective to reduce the cost.

What is claimed is:

1. A method for manufacturing GaP pure-green light emitting diodes, comprising:
   (a) growing by a two-step deposition on an n-type GaP substrate an n-type GaP epitaxial layer with a thickness of at least 100 μm and with a surface dislocation density less than $1 \times 10^4$ cm$^{-2}$, said two-step deposition comprising a first growth process of growing an n-type GaP epitaxial layer on said n-type GaP substrate and a second growth process of continuing the growth of said n-type GaP epitaxial layer to increase the thickness of said n-type GaP epitaxial layer; and
   (b) subsequently growing a p-type GaP epitaxial layer on said n-type GaP epitaxial layer,
   wherein step (a) includes a first liquid phase epitaxial growth process of growing a first n-type GaP epitaxial layer on said n-type GaP substrate with gradual cooling of a melt from approximately 1020° C. to 800° C. and a second liquid phase epitaxial growth process of growing a second n-type GaP epitaxial layer on said first n-type GaP epitaxial layer with gradual cooling of a melt from approximately 1020° C. to 900° C.

2. The method as recited in claim 1 wherein said p-type GaP epitaxial layer is grown on said second n-type GaP epitaxial layer by gradual cooling of a melt from approximately 900° C. to 800° C.

* * * * *